United States Patent
Nagai et al.

(10) Patent No.: US 7,232,741 B2
(45) Date of Patent: Jun. 19, 2007

(54) WAFER DIVIDING METHOD

(75) Inventors: Yusuke Nagai, Tokyo (JP); Masaru Nakamura, Tokyo (JP); Satoshi Kobayashi, Tokyo (JP); Yukio Morishige, Tokyo (JP)

(73) Assignee: Disco Corporation, Tokyo (JP)

( * ) Notice: Subject to any disclaimer, the term of this patent is extended or adjusted under 35 U.S.C. 154(b) by 104 days.

(21) Appl. No.: 10/968,100

(22) Filed: Oct. 20, 2004

(65) Prior Publication Data

US 2005/0090077 A1    Apr. 28, 2005

(30) Foreign Application Priority Data

Oct. 22, 2003  (JP) .............................. 2003-361471

(51) Int. Cl.
    *H01L 21/46*  (2006.01)
(52) U.S. Cl. ...................... 438/460; 438/461; 438/462; 438/463
(58) Field of Classification Search .................. 438/33, 438/68, 460, 461, 462, 463
    See application file for complete search history.

(56) References Cited

U.S. PATENT DOCUMENTS 6,451,152 B1 *  9/2002  Holmes et al. .......... 156/272.8
6,699,774 B2 *  3/2004  Takyu et al. .............. 438/460
2005/0064683 A1 *  3/2005  Farnworth et al. .......... 438/460

FOREIGN PATENT DOCUMENTS

JP    2002-192367    7/2002

\* cited by examiner

*Primary Examiner*—Thao P. Le
(74) *Attorney, Agent, or Firm*—Smith, Gambrell & Russell, LLP (57) ABSTRACT

A method of dividing a wafer along predetermined dividing lines, comprising the steps of a deteriorated layer forming step for applying a pulse laser beam capable of passing through the wafer along the dividing lines to form deteriorated layers in the inside of the wafer along the dividing lines; an extensible protective tape affixing step for affixing an extensible protective tape to one side of the wafer before or after the deteriorated layer forming step; and a dividing step for dividing the wafer along the deteriorated layers by expanding the protective tape affixed to the wafer after the deteriorated layer forming step.

5 Claims, 8 Drawing Sheets

WAFER DIVIDING METHOD

CROSS-REFERENCE TO RELATED APPLICATION

This application claims the benefit of Japan Patent Application No. 2003-361471, filed Oct. 22, 2003, the contents of which are hereby incorporated herein by reference in their entirety.

FIELD OF THE INVENTION

The present invention relates to a method of dividing a wafer having dividing lines formed on the front surface thereof along the dividing lines.

DESCRIPTION OF THE PRIOR ART

In the production process of a semiconductor device, a large number of rectangular areas are sectioned by dividing lines called "streets" arranged in a lattice pattern on the front surface of a substantially disk-like semiconductor wafer such as a silicon wafer, and a circuit such as IC or LSI is formed in each of the rectangular areas. Individual semiconductor chips are manufactured by dividing this semiconductor wafer having a large number of circuits formed thereon along the dividing lines. The semiconductor chips are widely used in electric equipment such as mobile telephones, personal computers, etc. Dividing along the dividing lines is generally carried out by a cutting machine called "dicer". This cutting machine comprises a chuck table for holding a plate-like workpiece such as a semiconductor wafer, a cutting means for cutting the workpiece held on the chuck table, and a moving means for moving the chuck table and the cutting means relative to each other. Thecutting means has a rotary spindle that is rotated at a high speed and a cutting blade mounted on the spindle. The cutting blade comprises a disk-like base and an annular cutting edge that is mounted on the side wall outer peripheral portion of the base and formed as thick as about 20 μm by fixing diamond abrasive grains having a diameter of about 3 μm to the base by electroforming.

Meanwhile, as a means of dividing a plate-like workpiece such as a semiconductor wafer or the like, a laser beam processing method for applying a pulse laser beam capable of passing through the workpiece to the workpiece with its focusing point on the inside of the area to be divided is attempted, and disclosed by JP-A 2002-192367, for example. In the dividing method using this laser beam processing technique, the workpiece is divided by applying a pulse laser beam of an infrared range, capable of passing through the workpiece to the workpiece with its focusing point on the inside, from one side of the workpiece to continuously form deteriorated layers in the inside of the workpiece along the dividing lines and applying external force along the dividing lines whose strength has been reduced by the formation of the deteriorated layers.

According to the technology disclosed by the above JP-A 2002-192367, the deteriorated layers are formed under the conditions that a pulse width of the pulse laser beam is set to be 1 μs or less and a peak power density of a processing portion is set to be $1\times10^8$ (W/cm$^2$) or more. The above publication discloses that the deteriorated layers can be formed under processing conditions of a laser beam wavelength of 1.06 μm, a pulse width of 30 μs, a pulse repetition frequency of 100 kHz and a processing-feed rate of 100 mm/sec.

However, the above dividing method has a problem with productivity because the wafer cannot be divided along the dividing lines simply by forming the deteriorated layers in the inside of the wafer along the streets and external force needs to be applied to each of the dividing lines after the deteriorated layers have been formed along the dividing lines.

SUMMARY OF THE INVENTION

It is an object of the present invention to provide a method of dividing a wafer, comprising applying a laser beam to a wafer along dividing lines to produce deteriorated layers in the inside thereof and dividing the wafer along deteriorated layers efficiently.

To attain the above object, according to the present invention, there is provided a method of dividing a wafer along predetermined dividing lines, comprising the steps of:

a deteriorated layer forming step for applying a pulse laser beam capable of passing through the wafer along the dividing lines to form deteriorated layers in the inside of the wafer along the dividing lines;

an extensible protective tape affixing step for affixing an extensible protective tape to one side of the wafer before or after the deteriorated layer forming step; and a dividing step for dividing the wafer along the deteriorated layers by expanding the protective tape affixed to the wafer after the deteriorated layer forming step.

Preferably, in the above deteriorated layer forming step, processing conditions are set to satisfy $1.0 \leq V/(Y \times D) \leq 2.5$ in which Y is a repetition frequency (Hz) of the pulse laser beam, D is a focusing spot diameter (mm) of the pulse laser beam, and V is a processing-feed speed (a relative moving speed of the wafer and the pulse laser beam) (mm/sec). Preferably, the frequency of the pulse laser beam in the deteriorated layer forming step is set to 200 kHz or higher. Further, preferably, the deteriorated layers formed in the deteriorated layer forming step are molten re-solidified layers and extend from one side to the other side of the wafer.

Further, in the deteriorated layer forming step, the outer peripheral portion of the protective tape affixed to one side of the wafer is mounted on an annular dicing frame.

In the present invention, the deteriorated layers are formed in the inside of the wafer along the dividing lines by applying a pulse laser beam capable of passing through the wafer along the dividing lines to the wafer, and the wafer is divided along the deteriorated layers by expanding the extensible protective tape affixed to one side of the wafer having the deteriorated layers formed therein. Therefore, the wafer can be divided efficiently.

DETAILED DESCRIPTION OF THE PREFERRED EMBODIMENT

A wafer dividing method according to a preferred embodiment of the present invention will be described in detail hereinunder with reference to the accompanying drawings.

Figure 1:
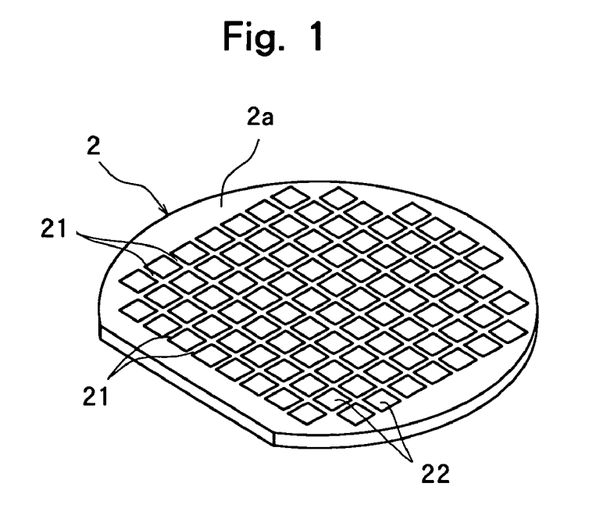
FIG. 1 is a perspective view of a semiconductor wafer to be divided by the wafer dividing method of the present invention.

FIG. 1 is a perspective view of a semiconductor wafer as a wafer to be divided according to the present invention. The semiconductor wafer 2 shown in FIG. 1 is, for example, a 300 μm-thick silicon wafer having a plurality of dividing lines 21 formed on a front surface 2a in a lattice pattern and circuits 22 formed in a plurality of areas sectioned by the plurality of dividing lines 21. The method of dividing this semiconductor wafer 2 into individual semiconductor chips will be described hereinunder.

To divide the semiconductor wafer 2 into individual semiconductor chips, the step of forming deteriorated layers in the inside of the wafer along the dividing lines by applying a pulse laser beam capable of passing through the wafer along the dividing lines is carried out. This deteriorated layer forming step is carried out by using a laser beam processing machine shown in FIGS. 2 to 4. The laser beam processing machine shown in FIGS. 2 to 4 comprises a chuck table 31 for holding a workpiece, a laser beam application means 32 for applying a laser beam to the workpiece held on the chuck table 31 and an image pick-up means 33 for picking up an image of the workpiece held on the chuck table 31. The chuck table 31 is designed to suction-hold the workpiece and moved in a processing-feed direction indicated by an arrow X and an indexing-feed direction indicated by an arrow Y in FIG. 2 by a moving mechanism that is not shown.

Figure 3:
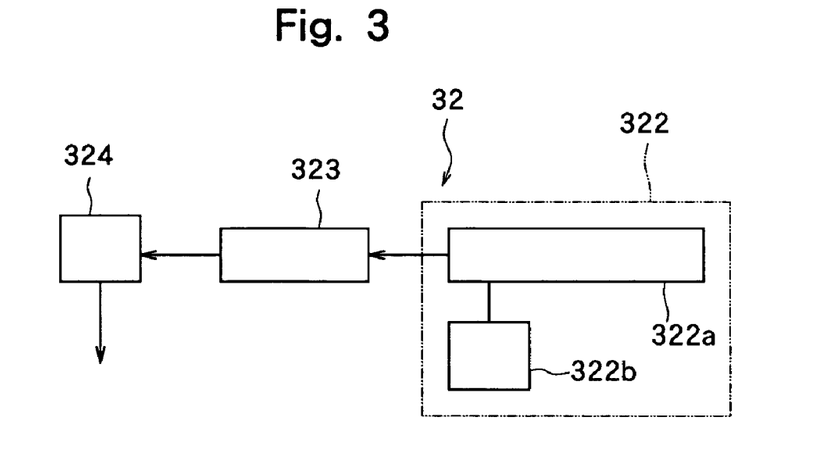
FIG. 3 is a block diagram schematically showing the constitution of a laser beam application means provided in the laser beam processing machine shown in FIG. 2.
Figure 4:
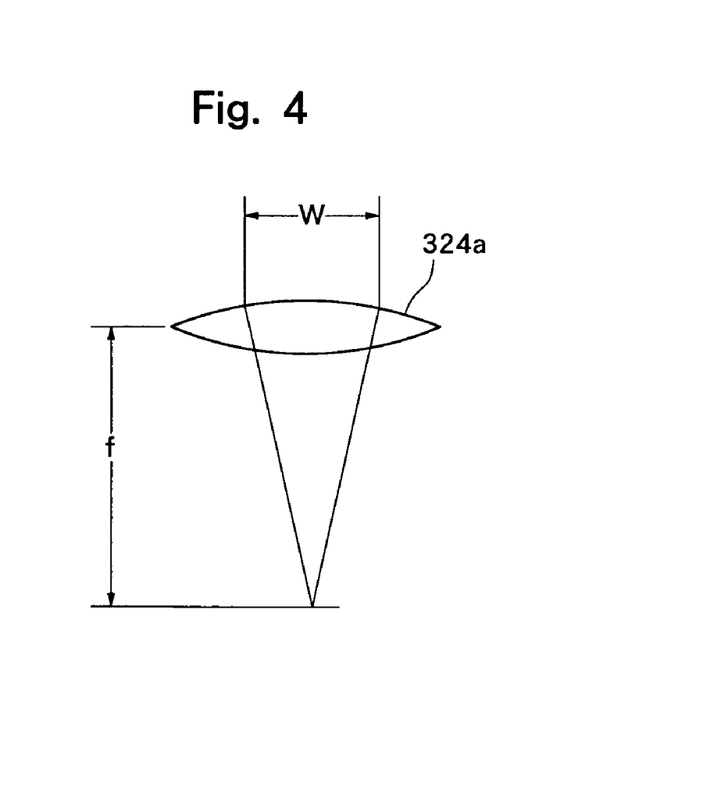
FIG. 4 is a schematic diagram for explaining the focusing spot diameter of a pulse laser beam.

The above laser beam application means 32 comprises a cylindrical casing 321 extending substantially horizontally. In the casing 321, there are installed a pulse laser beam oscillation means 322 and a transmission optical system 323 as shown in FIG. 3. The pulse laser beam oscillation means 322 is constituted by a pulse laser beam oscillator 322a composed of a YAG laser oscillator or a YVO4 laser oscillator and a repetition frequency setting means 322b connected to the pulse laser beam oscillator 322a. The transmission optical system 323 has suitable optical elements such as a beam splitter or the like. A condenser 324 housing condensing lenses (not shown) constituted by a conventionally known set of lenses is attached to the end of the above casing 321. A laser beam oscillated from the above pulse laser beam oscillation means 322 reaches the condenser 324 through the transmission optical system 323 and is applied, at a predetermined focusing spot diameter D, from the condenser 324 to the workpiece held on the above chuck table 31. This focusing spot diameter D is defined by the expression D (μm) =4×λ×f(π×W) (λ is the wavelength (μm) of the pulse laser beam, W is the diameter (mm) of the pulse laser beam projected to an objective lens 324a, and f is the focusing distance (mm) of the objective lens 324a) when the pulse laser beam having a Gauss distribution is applied through the objective lens 324a of the condenser 324, as shown in FIG. 4.

The image pick-up means 33 which is fitted to the front end of the casing 321 constituting the above laser beam application means 32 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that will be described later.

Figure 5:
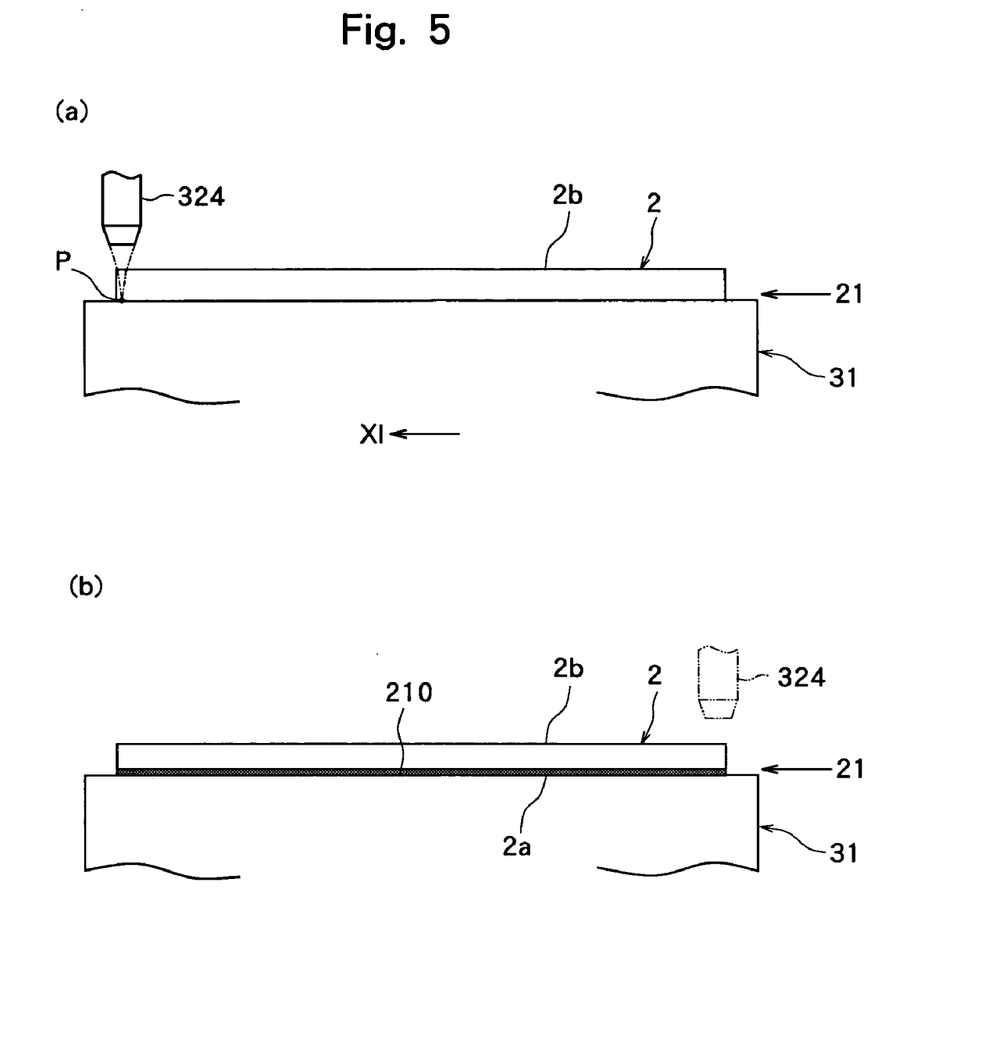
FIGS. 5(a) and 5(b) are explanatory diagrams showing the deteriorated layer forming step in the wafer dividing method of the present invention.
Figure 6:
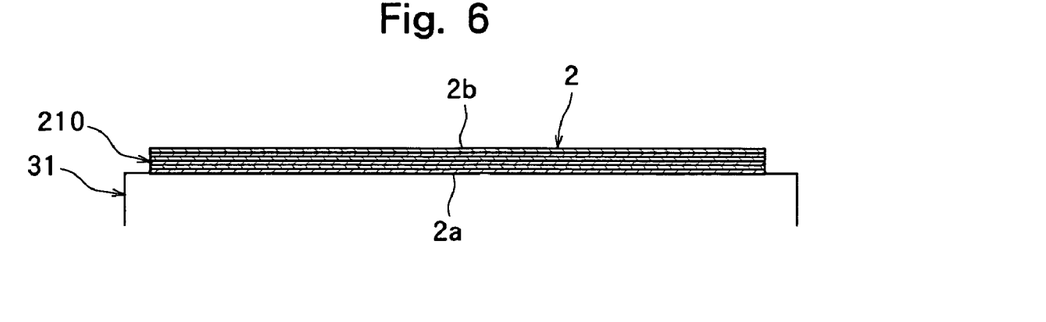
FIG. 6 is a diagram showing a state where deteriorated layers are laminated in the inside of the wafer in the deteriorated layer forming step shown in FIGS. 5(a) and 5(b)

The step of forming deteriorated layers by means of the above laser beam processing machine 3 will be described with reference to FIGS. 2, 5 and 6.

Figure 2:
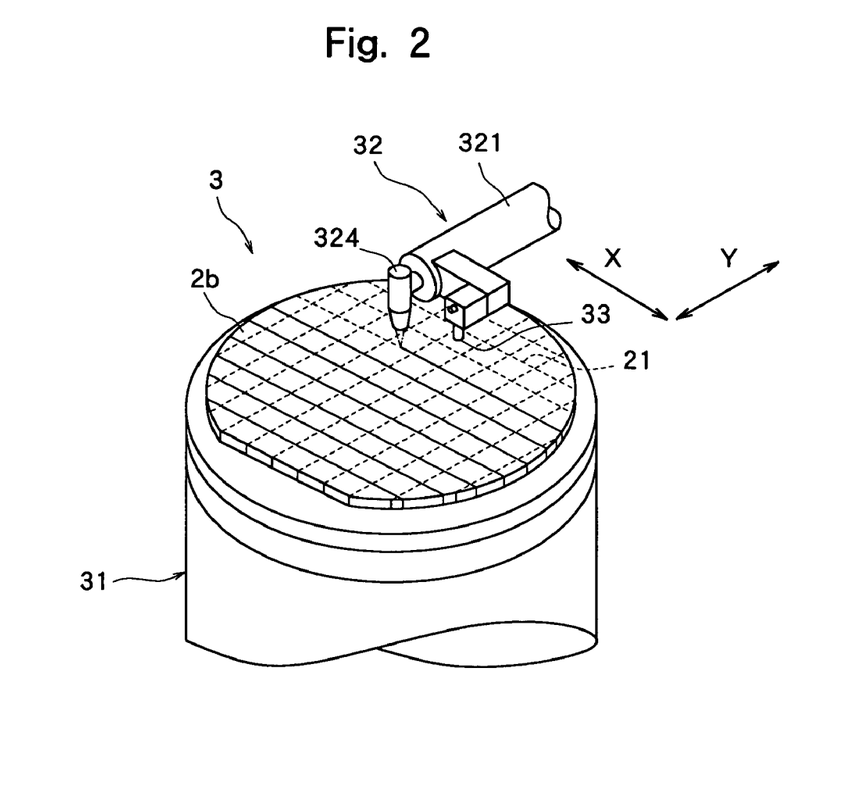
FIG. 2 is a perspective view of the principal section of a laser beam processing machine for carrying out the deteriorated layer forming step in the wafer dividing method of the present invention.

In this deteriorated layer forming step, the semiconductor wafer 2 is first placed on the chuck table 31 of the laser beam processing machine 3 shown in FIG. 2 in such a manner that its back surface 2b faces up and suction-held on the chuck table 31. The chuck table 31 suction-holding the semiconductor wafer 2 is brought to a position right below the image pick-up means 33 by a moving mechanism that is not shown.

After the chuck table 31 is positioned right below the image pick-up means 33, alignment work for detecting a processing area to be processed by a laser beam of the semiconductor wafer 2 is carried out by the image pick-up means 33 and a control means that is not shown. That is, the image pick-up means 33 and the control means carry out image processing such as pattern matching to align a dividing line 21 formed in a predetermined direction of the semiconductor wafer 2 with the condenser 324 of the laser beam application means 32 for applying a laser beam along the dividing line 21, thereby performing the alignment of a laser beam application position. The alignment of the laser beam application position is similarly carried out on dividing lines 21 formed on the semiconductor wafer 10 in a direction perpendicular to the above predetermined direction. Although the front surface 2a on which the dividing lines 21 of the semiconductor wafer 2 are formed faces down at this point, the dividing line 21 can be imaged from the back surface 2b as the image pick-up means 33 comprises an infrared illuminating means, an optical system for capturing infrared radiation and an image pick-up device (infrared CCD) for outputting an electric signal corresponding to the infrared radiation, as described above.

After the dividing line 21 formed on the semiconductor wafer 2 held on the chuck table 31 is detected and the alignment of the laser beam application position is carried out, the chuck table 31 is moved to a laser beam application range where the condenser 324 of the laser beam application means 32 for applying a laser beam is located, to bring one end (left end in FIG. 5(a)) of the predetermined dividing line 21 to a position right below the condenser 324 of the laser beam application means 32, as shown in FIG. 5(a). The chuck table 31, that is, the semiconductor wafer 2 is moved in the direction indicated by the arrow X1 in FIG. 5(a) at a predetermined feed rate while a pulse laser beam capable of passing through the semiconductor wafer 2 is applied from the condenser 324. Then, when the application position of the condenser 324 of the laser beam application means 32 reaches the other end of the dividing line 21 as shown in FIG. 5(b), the application of the pulse laser beam is suspended and the movement of the chuck table 31, that is, the semiconductor wafer 2 is stopped. In this deteriorated layer forming step, by setting the focusing point P of the pulse laser beam to the vicinity of the front surface 2a (undersurface) of the semiconductor wafer 2, a deteriorated layer 210 is exposed to the front surface 2a (undersurface) and is formed toward the inside from the front surface 2a. This deteriorated layer 210 is formed as a molten-resolidified layer.

The processing conditions in the above deteriorated layer forming step are set as follows, for example.
Light source: LD excited Q switch Nd:YVO4 laser
Wavelength: pulse laser having a wavelength of 1,064 nm
Pulse output: 10 μJ
Focusing spot diameter: 1 μm
Pulse width: 100 ns
Peak power density of focusing point: $1.3 \times 10^{10}$ W/cm$^2$
Repetition frequency: 200 to 400 kHz
Processing-feed rate: 200 to 400 mm/sec When the semiconductor wafer 2 is thick, the above deteriorated layer forming step is carried out several times by changing the focusing point P stepwise to form a plurality of deteriorated layers 210 as shown in FIG. 6. Since the deteriorated layer formed each time under the above processing conditions is as thick as about 50 μm, six deteriorated layers are formed in a 300 μm-thick wafer in the illustrated embodiment. As a result, the deteriorated layers 210 extending from the front surface 2a to the back surface 2b along the dividing lines 21 are formed in the inside of the semiconductor wafer 2.

Under the above processing conditions, the coefficient k defined by the expression k=V/(Y×D) (Y is the repetition frequency (Hz) of the pulse laser beam, D is the focusing spot diameter (mm) of the pulse laser beam and V is the processing-feed rate (mm/sec)) is desirably set to 1.0 to 2.5.

In other words, the repetition frequency Y, the focusing spot diameter D and the processing-feed rate V desirably satisfy an expression $1.0 \leq V/(Y \times D) \leq 2.5$.

Figure 7:
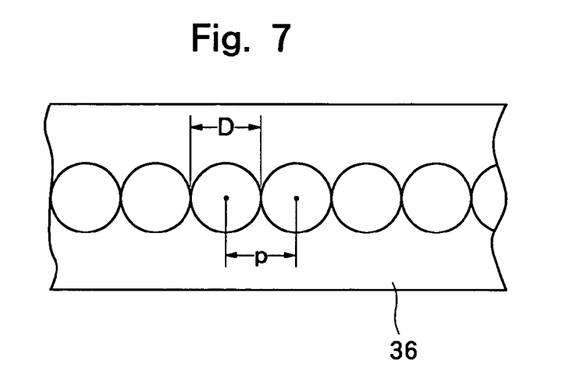
FIG. 7 is a diagram showing the sequence of spots of a pulse laser beam applied to the wafer when the coefficient k is 1 in the deteriorated layer forming step shown in FIGS. 5(a) and 5(b)
Figure 8:
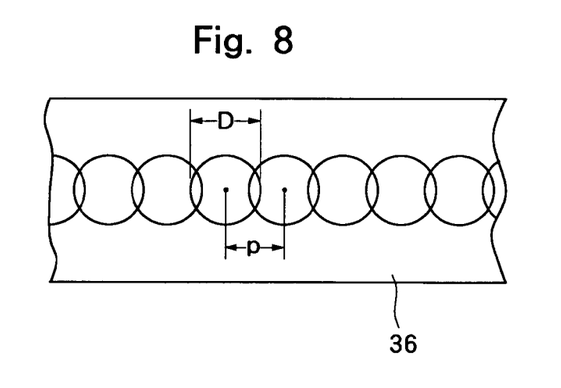
FIG. 8 is a diagram showing the sequence of spots of the pulse laser beam applied to the wafer when the coefficient k is smaller than 1 in the deteriorated layer forming step show in FIGS. 5(a) and 5(b)
Figure 9:
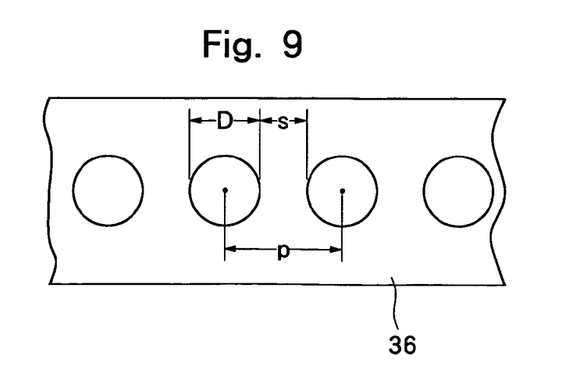
FIG. 9 is a diagram showing the sequence of spots of the pulse laser beam applied to the wafer when the coefficient k is larger than 1 in the deteriorated layer forming step show in FIGS. 5(a) and 5(b)

Stated more specifically, when a pulse laser beam having a repetition frequency Y is applied, at a focusing spot diameter D, to the semiconductor wafer 2 from the condenser 324 of the laser beam application means 32, and the chuck table 31, that is, the semiconductor wafer 2 is moved in the processing-feed direction, in the case of the above coefficient k is 1, the pitch p of the spots of the pulse laser beam is the same as the focusing spot diameter D, that is, the pulse laser beam is applied continuously along the dividing line 21 in such a state that the focusing spots of the pulse laser beam are in contact with each other (i.e., in such a state that the focusing spots do not overlap with one another and have no space between the adjacent spots), as shown in FIG. 7. When the above coefficient k is smaller than 1, the pulse laser beam is continuously applied along the dividing line 21 in such a manner that the spots of the pulse laser beam overlap with one another, as shown in FIG. 8. When the above coefficient k is larger than 1, the pulse laser beam is continuously applied along the dividing line 21 in such a manner that a space is formed between adjacent spots of the pulse laser beam, as shown in FIG. 9. When the above coefficient k is 2, the interval "s" between adjacent spots becomes the same as the focusing spot diameter D.

EXPERIMENTAL EXAMPLE 1

Figure 10:
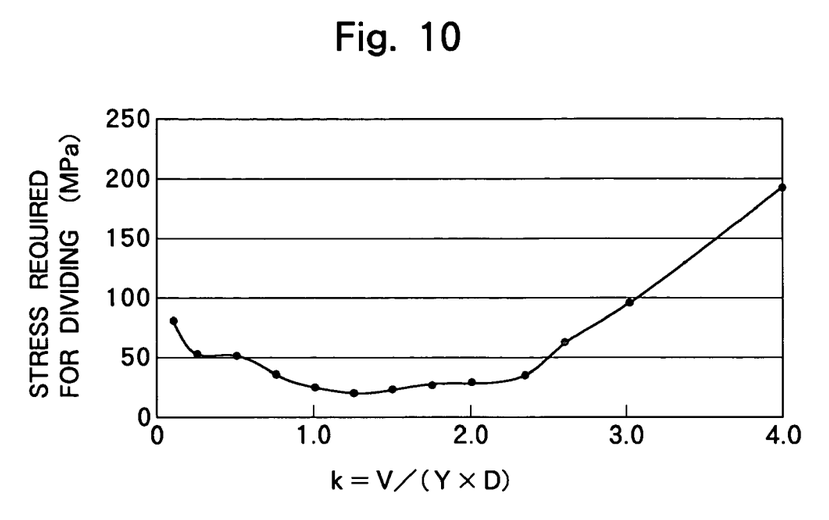
FIG. 10 is a graph showing changes in external force required for dividing the wafer by variations in the coefficient k.

The above deteriorated layers were formed in a semiconductor wafer having a diameter of 6 inches and a thickness of 300 μm by changing the above coefficient k in a range of from 0.1 to 4.0 under the above processing conditions, and stress required for dividing the semiconductor wafer along each dividing line was measured in each of cases. For the measurement of stress, a three-point bending test was carried out in which the back surface of the semiconductor wafer was supported along the dividing line at positions 2.0 mm away from the dividing line on both sides and a load was applied to the front surface of the semiconductor wafer along the dividing line. The measured stress was stress on a cross section based on the load at the time when the semiconductor wafer was divided. The measurement results are shown in FIG. 10. It is understood that when the coefficient k is 1.0 to 2.5, stress required for dividing the semiconductor wafer is small.

Figure 11:
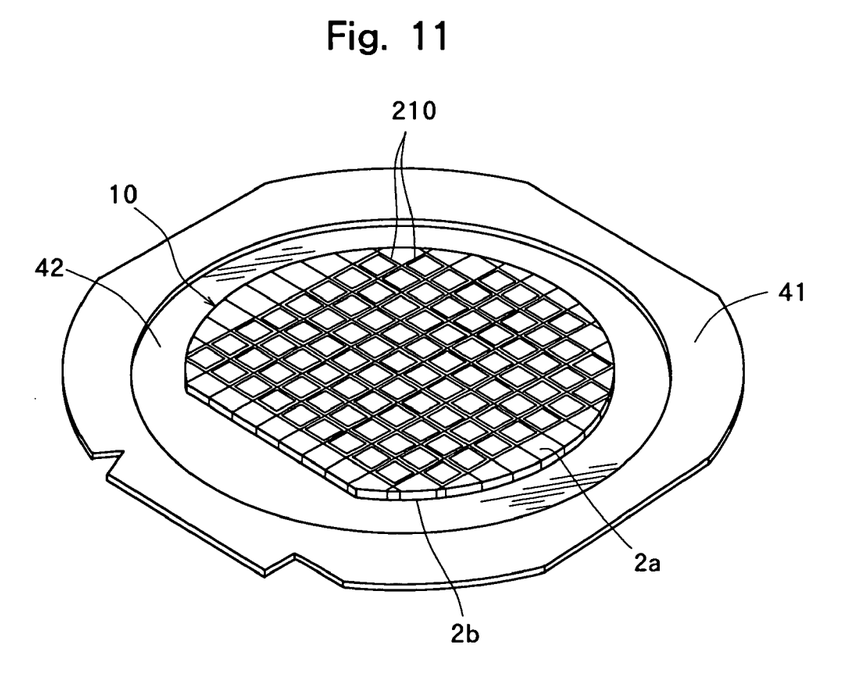
FIG. 11 is an explanatory diagram showing the protective tape affixing step in the wafer dividing method of the present invention.

After the deteriorated layers 210 were formed in the inside of the semiconductor wafer 2 along the dividing lines 21 in the above deteriorated layer forming step, the step of affixing an extensible protective tape to one side of the wafer was carried out. That is, as shown in FIG. 11, the front surface of the extensible protective tape 42 whose outer peripheral portion was mounted on an annular dicing frame 41 to cover its inner opening was affixed to the back surface 2b of the semiconductor wafer 2. In the above protective tape 42, acrylic resin-based paste with a thickness of about 5 μm was applied to the surface of a 70 μm-thick sheet substrate made of polyvinyl chloride (PVC) in the illustrated embodiment. A type of the paste whose adhesive strength was reduced by an external stimulus such as ultraviolet radiation was used. The protective tape affixing step may be carried out before the above deteriorated layer forming step. That is, the deteriorated layer forming step is carried out in a state where the semiconductor wafer 2 is supported on the dicing frame 41 by affixing the protective tape 42 onto the front surface 2a of the semiconductor wafer 2 in such a manner that the back surface 2b faces up.

After the above deteriorated layer forming step and the protective tape affixing step have been carried out, the step of dividing the semiconductor wafer 2 along the deteriorated layers 210 was carried out by expanding the protective tape 42 affixed to the semiconductor wafer 2. This dividing step was carried out by using a pick-up device 5 shown in FIG. 12 and FIGS. 13(*a*) and 13(*b*). The pick-up device 5 will be described hereinbelow. The illustrated pick-up device 5 comprises a cylindrical base 51 having a placing surface 511 for placing the above dicing frame 41 and an expanding means 52 that is installed in the base 51 concentrically and works for expanding the protective tape 42 mounted on the dicing frame 41. The expanding means 52 has a cylindrical expanding member 521 for supporting an area 421 where the wafer 2 in the above protective tape 42 exists. This expanding member 521 is so constituted as to be moved in an up-and-down direction (in the axial direction of the cylindrical base 51) between a standard position shown in FIG. 13(*a*) and a expanding position shown in FIG. 13(*b*) above the standard position by a lifting means that is not shown. In the illustrated embodiment, ultraviolet lamps 53 are installed in the expanding member 521.

The dividing step which is carried out by the above pick-up device will be described with reference to FIG. 12 and FIGS. 13(*a*) and 13(*b*).

Figure 12:
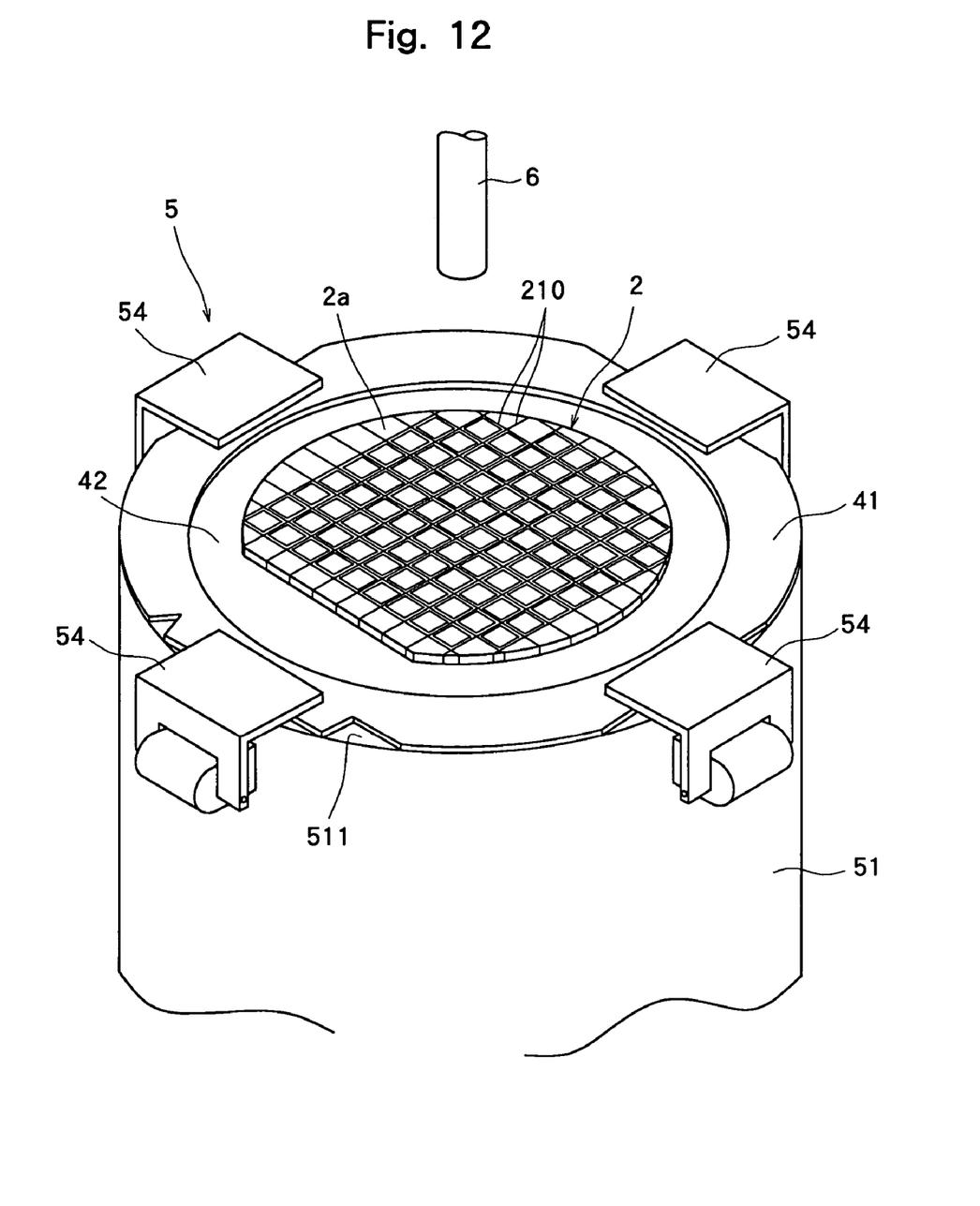
FIG. 12 is a perspective view of a pick-up device for carrying out the dividing step in the wafer dividing method of the present invention.
Figure 13:
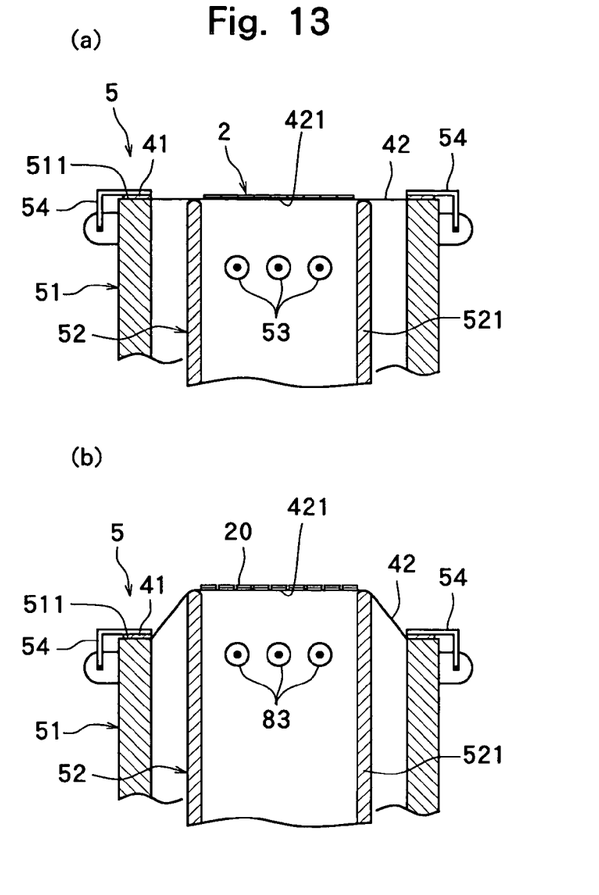
FIGS. 13(a) and 13(b) are explanatory diagrams showing the dividing step in the wafer dividing method of the present invention.

The dicing frame 41 mounting the protective tape 42 affixed to the back surface of the semiconductor wafer 2 as described above is placed on the placing surface 511 of the cylindrical base 51 and fixed on the base 51 by clamps 54 as shown in FIG. 12 and FIG. 13(*a*). Then, the expanding member 521 of the expanding means 52 supporting the area 421 where the wafer 2 in the above protective tape 42 exists is moved up to the expanding position shown in FIG. 13(*b*) from the standard position shown in FIG. 13(*a*) by the lifting means that is not shown. As a result, the extensible protective tape 42 is expanded so that tensile force acts radially on the semiconductor wafer 2 to which the protective tape 42 is affixed. When tensile force acts radially on the semiconductor wafer 2 as described above, the semiconductor wafer 2 is divided into individual semiconductor chips 20 along the deteriorated layers 210 as the strength of the deteriorated layers 210 formed along the dividing lines has been reduced. The amount of the expansion, i.e., elongation of the protective tape 42 in the above dividing step can be adjusted by the upward movement amount of the expanding member 521. According to experiments conducted by the inventors of the present invention, the semiconductor wafer 2 could be divided along the deteriorated layers 210 when the protective tape 42 was expanded about 20 mm.

EXPERIMENTAL EXAMPLE 2

Figure 15:
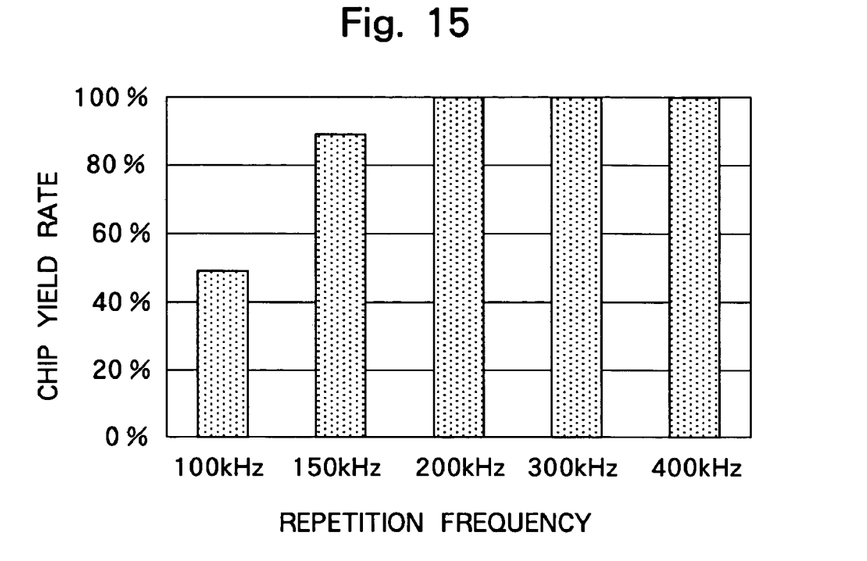
FIG. 15 is a graph showing the relationship between the repetition frequency of a pulse laser beam applied in the deteriorated layer forming step and the yield rate of chips obtained by dividing the wafer along the deteriorated layers in the wafer dividing method of the present invention.

A semiconductor wafer (silicon wafer) having a diameter of 6 inches and a thickness of 300 μm was divided into semiconductor chips of 2 mm×2 mm by the above-described method. FIG. 15 shows the yield rate of semiconductor chips obtained by dividing the semiconductor wafer along the deteriorated layers by carrying out the above dividing step (to be referred to as "tape expanding method" hereinafter) when the repetition frequency of the pulse laser beam applied in the above deteriorated layer forming step was set to 100 kHz, 150 kHz, 200 kHz, 300 kHz or 400 kHz (in this Example, the above coefficient k was 1). In FIG. 15, the horizontal axis shows the repetition frequency of the pulse laser beam applied in the above deteriorated layer forming step and the vertical axis shows the chip yield rate obtained by dividing the number of semiconductor chips obtained from the semiconductor wafer by carrying out the above tape expanding method, by the number of semiconductor chips formed on the above semiconductor wafer and multiplying the obtained value by 100.

As understood from FIG. 15, when the repetition frequency of the pulse laser beam applied in the above deteriorated layer forming step was 100 kHz, only half of the chips formed on the semiconductor wafer could be separated as individual chips by the above tape expanding method and the other half could not be separated. Even though the tension force of the protective tape 42 was increased for the chips which could not be separated, the deteriorated layers were not broken. However, when a bending load was applied to the deteriorated layers to generate bending stress, the deteriorated layers were easily broken. When the repetition frequency of the pulse laser beam applied in the above deteriorated layer forming step was 150 kHz, 95% of the chips could be separated by the above tape expanding method. It is understood that when the repetition frequency of the pulse laser beam applied in the above deteriorated layer forming step was 200 kHz or higher, the chip yield rate reached 100%.

The reason why the chip yield rate dropped when the repetition frequency of the pulse laser beam applied in the above deteriorated layer forming step was 150 kHz or lower will be studied hereinbelow. When the cross section of a deteriorated layer formed by applying a pulse laser beam having the above repetition frequency was observed, the deteriorated layer was formed all over the thickness direction of all the semiconductor chips. The reason why this was confirmed is that when there is a portion where the deteriorated layer is not formed, stress required for dividing is remarkably increased with the consequence the chip yield rate may be reduced.

Figure 16:
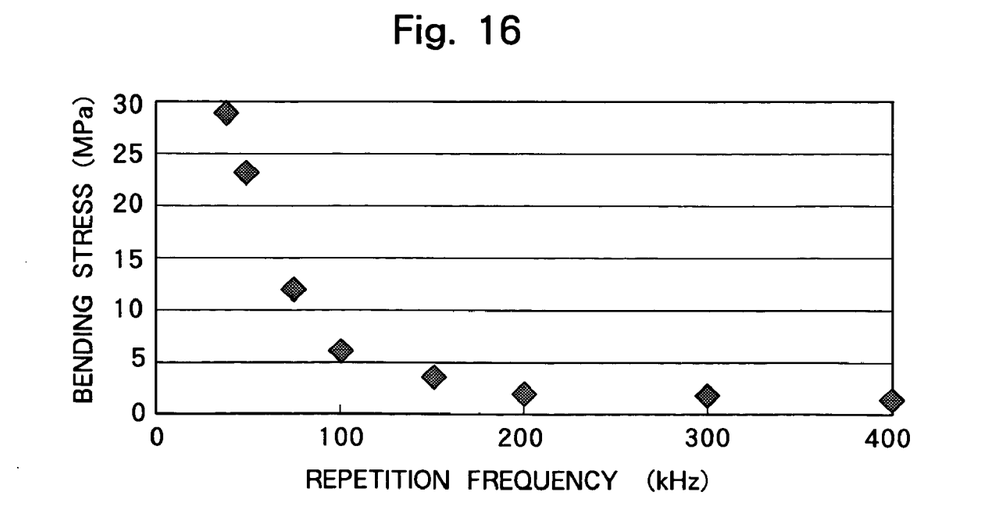
FIG. 16 is a graph showing the relationship between the repetition frequency of the pulse laser beam applied in the deteriorated layer forming step and bending stress required for breaking the deteriorated layers in the wafer dividing method of the present invention.

FIG. 16 shows the results of a test for measuring bending stress required for breaking the above deteriorated layer by the three-point bending method. In FIG. 16, the horizontal axis shows the repetition frequency (kHz) of the pulse laser beam for forming a deteriorated layer and the vertical axis shows bending stress (MPa) required for breaking the deteriorated layer. As understood from FIG. 16, as the repetition frequency of the pulse laser beam for forming a deteriorated layer becomes 150 kHz or lower, bending stress required for breaking the deteriorated layer increases. However, when the repetition frequency of the pulse laser beam for forming the deteriorated layer is 200 kHz or higher, bending stress required for breaking the deteriorated layer is 2 MPa or less. The stress required for breaking the deteriorated layer has relation to the chip yield rate obtained by the above tape expanding method. That is, the chip yield rate obtained by the tape expanding method decreases as the stress increases. When the stress becomes a predetermined value or lower, however, the chip yield rate obtained by the tape expanding method becomes 100%. Therefore, the repetition frequency of the pulse laser beam applied in the above deteriorated layer forming step is desirably set to 200 kHz or higher.

As described above, by carrying out the dividing step by the tape expanding method, a gap is formed between the protective tape 42 and the semiconductor chips 20 to reduce adhesion therebetween, thereby making it possible to pick up the semiconductor chips 20 from the protective tape 42 easily and forming a space between adjacent individual semiconductor chips 20 as shown in FIG. 13(*b*).

Figure 14:
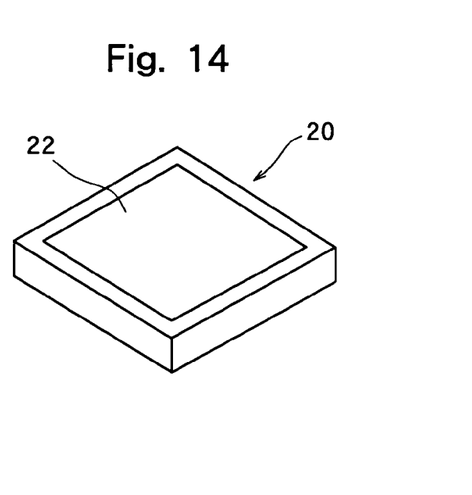
FIG. 14 is a perspective view of a semiconductor chip obtained by the wafer dividing method of the present invention.

Then, as shown in FIG. 12, a pick-up collet 6 arranged above the pick-up device 5 is activated to pick up the individual semiconductor chips 20 from the protective tape 42 and carried to a tray that is not shown. At this point, the ultraviolet lamps 53 in the expanding member 521 are turned on to apply ultraviolet radiation to the protective tape 42 so as to reduce the adhesive strength of the protective tape 42, thereby making it possible to pick up the semiconductor chips 20 from the protective tape 42 more easily. The semiconductor chips 20 picked up from the protective tape 42 as shown in FIG. 14 are obtained.

We claim:

1. A method of dividing a wafer along predetermined dividing lines, comprising the steps of:
   a deteriorated layer forming step for applying a pulse laser beam capable of passing through the wafer along the dividing lines to form deteriorated layers in the inside of the wafer along the dividing lines;
   an extensible protective tape affixing step for affixing an extensible protective tape to one side of the wafer before or after the deteriorated layer forming step; and
   a dividing step for dividing the wafer along the deteriorated layers by expanding the protective tape affixed to the wafer after the deteriorated layer forming step,
   wherein processing conditions are set to satisfy $1.0 \leq V/(Y \times D) \leq 2.5$ in which Y is a repetition frequency (Hz) of the pulse laser beam, D is a focusing spot diameter (mm) of the pulse laser beam, and V is a processing-feed speed which is a relative moving speed of the wafer and the pulse laser beam (mm/sec) in the deteriorated layer forming step.

2. The wafer dividing method according to claim 1, wherein the frequency of the pulse laser beam in the deteriorated layer forming step is set to 200 kHz or higher.

3. The wafer dividing method according to claim 1, wherein the deteriorated layers formed in the deteriorated layer forming step are molten re-solidified layers.

4. The wafer dividing method according to claim 2, wherein the deteriorated layers formed in the deteriorated layer forming step extend from one side to the other side of the wafer.

5. The wafer dividing method according to claim 1, wherein the outer peripheral portion of the protective tape affixed to one side of the wafer in the deteriorated layer forming step is mounted on an annular dicing frame.

* * * * *